United States Patent
Pan et al.

(10) Patent No.: US 8,054,681 B2
(45) Date of Patent: Nov. 8, 2011

(54) READ, VERIFY WORD LINE REFERENCE VOLTAGE TO TRACK SOURCE LEVEL

(75) Inventors: Feng Pan, Fremont, CA (US); Trung Pham, Fremont, CA (US); Byungki Woo, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 122 days.

(21) Appl. No.: 12/715,858

(22) Filed: Mar. 2, 2010

(65) Prior Publication Data

US 2010/0157681 A1   Jun. 24, 2010

Related U.S. Application Data

(62) Division of application No. 11/961,917, filed on Dec. 20, 2007, now Pat. No. 7,701,761.

(51) Int. Cl.
    *G11C 11/34*  (2006.01)
(52) U.S. Cl. ......... 365/185.02; 365/185.22; 365/185.21; 365/185.09; 365/189.07; 365/189.15; 365/185.23
(58) Field of Classification Search ............. 365/185.02, 365/185.22, 185.21, 185.09, 189.07, 189.15, 365/185.23
See application file for complete search history.

(56) References Cited

U.S. PATENT DOCUMENTS

| | | | |
|---|---|---|---|
| 4,357,685 A | 11/1982 | Daniele et al. | |
| 5,070,032 A | 12/1991 | Yuan et al. | |
| 5,095,344 A | 3/1992 | Harari | |
| 5,172,338 A | 12/1992 | Mehrotra et al. | |
| 5,313,421 A | 5/1994 | Guterman et al. | |
| 5,315,541 A | 5/1994 | Harari et al. | |
| 5,343,063 A | 8/1994 | Yuan et al. | |
| 5,418,752 A | 5/1995 | Harari et al. | |
| 5,453,955 A | 9/1995 | Sakui et al. | |
| 5,570,315 A | 10/1996 | Tanaka et al. | |
| 5,595,924 A | 1/1997 | Yuan et al. | |
| 5,661,053 A | 8/1997 | Yuan | |

(Continued)

FOREIGN PATENT DOCUMENTS

EP    1 331 644    7/2003

(Continued)

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

(Continued)

*Primary Examiner* — Viet Nguyen
(74) *Attorney, Agent, or Firm* — Davis Wright Tremaine LLP

(57) ABSTRACT

A non-volatile memory device has individual pages of memory cells to be sensed in parallel. The memory device includes a source level tracking circuit coupled to receive a predetermined word line voltage from a word line voltage supply and the voltage level at the aggregate source node of one or more pages and coupled to provide to word lines of the memory an output voltage during the sensing operation, where the source level tracking circuit includes an op amp whereby the output voltage is the word line voltage offset by an amount to track the voltage level at the aggregate node and compensate for source bias errors due to a finite resistance in the ground loop.

12 Claims, 10 Drawing Sheets

U.S. PATENT DOCUMENTS

| | | |
|---|---|---|
| 5,689,470 A | 11/1997 | Inoue |
| 5,768,192 A | 6/1998 | Eitan |
| 5,774,397 A | 6/1998 | Endoh et al. |
| 5,903,495 A | 5/1999 | Takeuchi et al. |
| 6,011,725 A | 1/2000 | Eitan |
| 6,046,935 A | 4/2000 | Takeuchi et al. |
| 6,055,190 A | 4/2000 | Lu et al. |
| 6,087,894 A | 7/2000 | Barrett et al. |
| 6,118,702 A | 9/2000 | Shieh et al. |
| 6,125,052 A | 9/2000 | Tanaka et al. |
| 6,222,762 B1 | 4/2001 | Guterman et al. |
| 6,373,753 B1 | 4/2002 | Proebsting |
| 6,574,140 B2 | 6/2003 | Caywood |
| 6,950,336 B2 | 9/2005 | Sowards et al. |
| 6,987,693 B2 | 1/2006 | Cernea et al. |
| 7,023,736 B2 | 4/2006 | Cernea et al. |
| 7,046,568 B2 | 5/2006 | Cernea et al. |
| 7,170,784 B2 * | 1/2007 | Cernea et al. ............ 365/185.12 |
| 7,173,854 B2 * | 2/2007 | Cernea et al. ............ 365/185.12 |
| 7,391,645 B2 * | 6/2008 | Cernea et al. ............ 365/185.12 |
| 7,391,646 B2 * | 6/2008 | Cernea et al. ............ 365/185.12 |
| 7,453,741 B2 | 11/2008 | Kim et al. |
| 7,489,553 B2 | 2/2009 | Mokhlesi |
| 7,492,640 B2 | 2/2009 | Mokhlesi |
| 7,499,324 B2 * | 3/2009 | Cernea et al. ............ 365/185.12 |
| 7,593,265 B2 | 9/2009 | Nguyen et al. |
| 7,606,071 B2 | 10/2009 | Sekar et al. |
| 7,606,076 B2 | 10/2009 | Nguyen et al. |
| 7,701,761 B2 * | 4/2010 | Pan et al. ............ 365/185.02 |
| 7,764,547 B2 * | 7/2010 | Lee et al. ............ 365/185.17 |
| 2004/0057287 A1 | 3/2004 | Cernea et al. |
| 2004/0057318 A1 | 3/2004 | Cernea et al. |
| 2004/0109357 A1 | 6/2004 | Cernea et al. |
| 2005/0169082 A1 | 8/2005 | Cernea et al. |
| 2005/0213387 A1 | 9/2005 | Kubo et al. |
| 2006/0221693 A1 | 10/2006 | Cernea et al. |
| 2007/0058429 A1 | 3/2007 | Umezawa |
| 2009/0161433 A1 | 6/2009 | Lee et al. |

FOREIGN PATENT DOCUMENTS

| | | |
|---|---|---|
| WO | WO 01/63618 | 8/2001 |
| WO | WO 2006/105363 | 10/2006 |

OTHER PUBLICATIONS

Notification of Transmittal of the International Search Report and the Written Opinion of the International Searching Authority, or the Declaration for International Application No. PCT/US2008/086870, mailed Mar. 19, 2009, 13 pages.

* cited by examiner

READ, VERIFY WORD LINE REFERENCE VOLTAGE TO TRACK SOURCE LEVEL

CROSS REFERENCE TO RELATED APPLICATIONS

This application is a divisional of U.S. patent application Ser. No. 11/961,917 filed on Dec. 20, 2007, now U.S Pat. No. 7,701,761 which is incorporated herein in its entirety by this reference.

FIELD OF THE INVENTION

This invention relates generally to non-volatile semiconductor memory such as electrically erasable programmable read-only memory (EEPROM) and flash EEPROM, and specifically ones having improved sensing circuits that compensate for source bias errors due to a finite resistance in the ground loop.

BACKGROUND OF THE INVENTION

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retaining its stored data even after power is turned off. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card is ideally suited in the mobile and handheld environment because of its small size, low power consumption, high speed and high reliability features.

EEPROM and electrically programmable read-only memory (EPROM) are non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate.

The memory device may be erased by a number of mechanisms. For EPROM, the memory is bulk erasable by removing the charge from the floating gate by ultraviolet radiation. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more blocks at a time, where a block may consist of 512 bytes or more of memory.

Examples of Non-Volatile Memory Cells

The memory devices typically comprise one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing. There are many commercially successful non-volatile solid-state memory devices being used today. These memory devices may employ different types of memory cells, each type having one or more charge storage element.

FIGS. 1A-1E illustrate schematically different examples of non-volatile memory cells.

FIG. 1A illustrates schematically a non-volatile memory in the form of an EEPROM cell with a floating gate for storing charge. An electrically erasable and programmable read-only memory (EEPROM) has a similar structure to EPROM, but additionally provides a mechanism for loading and removing charge electrically from its floating gate upon application of proper voltages without the need for exposure to UV radiation. Examples of such cells and methods of manufacturing them are given in U.S. Pat. No. 5,595,924.

FIG. 1B illustrates schematically a flash EEPROM cell having both a select gate and a control or steering gate. The memory cell 10 has a "split-channel" 12 between source 14 and drain 16 diffusions. A cell is formed effectively with two transistors T1 and T2 in series. T1 serves as a memory transistor having a floating gate 20 and a control gate 30. The floating gate is capable of storing a selectable amount of charge. The amount of current that can flow through the T1's portion of the channel depends on the voltage on the control gate 30 and the amount of charge residing on the intervening floating gate 20. T2 serves as a select transistor having a select gate 40. When T2 is turned on by a voltage at the select gate 40, it allows the current in the T1's portion of the channel to pass between the source and drain. The select transistor provides a switch along the source-drain channel independent of the voltage at the control gate. One advantage is that it can be used to turn off those cells that are still conducting at zero control gate voltage due to their charge depletion (positive) at their floating gates. The other advantage is that it allows source side injection programming to be more easily implemented.

One simple embodiment of the split-channel memory cell is where the select gate and the control gate are connected to the same word line as indicated schematically by a dotted line shown in FIG. 1B. This is accomplished by having a charge storage element (floating gate) positioned over one portion of the channel and a control gate structure (which is part of a word line) positioned over the other channel portion as well as over the charge storage element. This effectively forms a cell with two transistors in series, one (the memory transistor) with a combination of the amount of charge on the charge storage element and the voltage on the word line controlling the amount of current that can flow through its portion of the channel, and the other (the select transistor) having the word line alone serving as its gate. Examples of such cells, their uses in memory systems and methods of manufacturing them are given in U.S. Pat. Nos. 5,070,032, 5,095,344, 5,315,541, 5,343,063, and 5,661,053.

A more refined embodiment of the split-channel cell shown in FIG. 1B is when the select gate and the control gate are independent and not connected by the dotted line between them. One implementation has the control gates of one column in an array of cells connected to a control (or steering) line perpendicular to the word line. The effect is to relieve the word line from having to perform two functions at the same time when reading or programming a selected cell. Those two functions are (1) to serve as a gate of a select transistor, thus requiring a proper voltage to turn the select transistor on and off, and (2) to drive the voltage of the charge storage element to a desired level through an electric field (capacitive) coupling between the word line and the charge storage element. It is often difficult to perform both of these functions in an optimum manner with a single voltage. With the separate control of the control gate and the select gate, the word line need only perform function (1), while the added control line performs function (2). This capability allows for design of higher performance programming where the programming voltage is geared to the targeted data. The use of independent control (or steering) gates in a flash EEPROM array is described, for example, in U.S. Pat. Nos. 5,313,421 and 6,222,762.

FIG. 1C illustrates schematically another flash EEPROM cell having dual floating gates and independent select and control gates. The memory cell 10 is similar to that of FIG. 1B except it effectively has three transistors in series. In this type of cell, two storage elements (i.e., that of T1—left and T1—right) are included over its channel between source and drain diffusions with a select transistor T1 in between them. The memory transistors have floating gates 20 and 20', and control gates 30 and 30', respectively. The select transistor T2 is controlled by a select gate 40. At any one time, only one of the pair of memory transistors is accessed for read or write. When the storage unit T1—left is being accessed, both the T2 and T1—right are turned on to allow the current in the T1—left's portion of the channel to pass between the source and the drain. Similarly, when the storage unit T1—right is being accessed, T2 and T1—left are turned on. Erase is effected by having a portion of the select gate polysilicon in close proximity to the floating gate and applying a substantial positive voltage (e.g. 20V) to the select gate so that the electrons stored within the floating gate can tunnel to the select gate polysilicon.

FIG. 1D illustrates schematically a string of memory cells organized into an NAND chain. An NAND chain 50 consists of a series of memory transistors M1, M2, . . . Mn (n=4, 8, 16 or higher) daisy-chained by their sources and drains. A pair of select transistors S1, S2 controls the memory transistors chain's connection to the external via the NAND chain's source terminal 54 and drain terminal 56. In a memory array, when the source select transistor S1 is turned on, the source terminal is coupled to a source line. Similarly, when the drain select transistor S2 is turned on, the drain terminal of the NAND chain is coupled to a bit line of the memory array. Each memory transistor in the chain has a charge storage element to store a given amount of charge so as to represent an intended memory state. A control gate of each memory transistor provides control over read and write operations. A control gate of each of the select transistors S1, S2 provides control access to the NAND chain via its source terminal 54 and drain terminal 56 respectively.

When an addressed memory transistor within an NAND chain is read and verified during programming, its control gate is supplied with an appropriate voltage. At the same time, the rest of the non-addressed memory transistors in the NAND chain 50 are fully turned on by application of sufficient voltage on their control gates. In this way, a conductive path is effective created from the source of the individual memory transistor to the source terminal 54 of the NAND chain and likewise for the drain of the individual memory transistor to the drain terminal 56 of the chain. Memory devices with such NAND chain structures are described in U.S. Pat. Nos. 5,570,315, 5,903,495, 6,046,935.

FIG. 1E illustrates schematically a non-volatile memory with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, Nov. 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

Memory Array

A memory device typically comprises of a two-dimensional array of memory cells arranged in rows and columns and addressable by word lines and bit lines. The array can be formed according to an NOR type or an NAND type architecture.

NOR Array

FIG. 2 illustrates an example of an NOR array of memory cells. Memory devices with an NOR type architecture have been implemented with cells of the type illustrated in FIG. 1B or 1C. Each row of memory cells are connected by their sources and drains in a daisy-chain manner. This design is sometimes referred to as a virtual ground design. Each memory cell 10 has a source 14, a drain 16, a control gate 30 and a select gate 40. The cells in a row have their select gates connected to word line 42. The cells in a column have their sources and drains respectively connected to selected bit lines 34 and 36. In some embodiments where the memory cells have their control gate and select gate controlled independently, a steering line 30 also connects the control gates of the cells in a column.

Many flash EEPROM devices are implemented with memory cells where each is formed with its control gate and select gate connected together. In this case, there is no need for steering lines and a word line simply connects all the control gates and select gates of cells along each row. Examples of these designs are disclosed in U.S. Pat. Nos. 5,172,338 and 5,418,752. In these designs, the word line essentially performed two functions: row selection and supplying control gate voltage to all cells in the row for reading or programming.

NAND Array

FIG. 3 illustrates an example of an NAND array of memory cells, such as that shown in FIG. 1D. Along each column of NAND chains, a bit line is coupled to the drain terminal 56 of each NAND chain. Along each row of NAND chains, a source line may connect all their source terminals 54. Also the control gates of the NAND chains along a row are connected to a series of corresponding word lines. An entire row of NAND chains can be addressed by turning on the pair of select transistors (see FIG. 1D) with appropriate voltages on their control gates via the connected word lines. When a memory transistor representing a memory cell within the NAND chain is being read, the remaining memory transistors in the chain are turned on hard via their associated word lines so that the current flowing through the chain is essentially dependent upon the level of charge stored in the cell being read. An example of an NAND architecture array and its operation as part of a memory system is found in U.S. Pat. Nos. 5,570,315, 5,774,397 and 6,046,935.

Block Erase

Programming of charge storage memory devices can only result in adding more charge to its charge storage elements. Therefore, prior to a program operation, existing charge in a charge storage element must be removed (or erased). Erase circuits (not shown) are provided to erase one or more blocks of memory cells. A non-volatile memory such as EEPROM is referred to as a "Flash" EEPROM when an entire array of cells, or significant groups of cells of the array, is electrically erased together (i.e., in a flash). Once erased, the group of cells can then be reprogrammed. The group of cells erasable together may consist of one or more addressable erase unit. The erase unit or block typically stores one or more pages of data, the page being the unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in with it is stored.

Read/Write Circuits

In the usual two-state EEPROM cell, at least one current breakpoint level is established so as to partition the conduction window into two regions. When a cell is read by applying predetermined, fixed voltages, its source/drain current is resolved into a memory state by comparing with the breakpoint level (or reference current $I_{REF}$). If the current read is higher than that of the breakpoint level, the cell is determined to be in one logical state (e.g., a "zero" state). On the other hand, if the current is less than that of the breakpoint level, the cell is determined to be in the other logical state (e.g., a "one" state). Thus, such a two-state cell stores one bit of digital information. A reference current source, which may be externally programmable, is often provided as part of a memory system to generate the breakpoint level current.

In order to increase memory capacity, flash EEPROM devices are being fabricated with higher and higher density as the state of the semiconductor technology advances. Another method for increasing storage capacity is to have each memory cell store more than two states.

For a multi-state or multi-level EEPROM memory cell, the conduction window is partitioned into more than two regions by more than one breakpoint such that each cell is capable of storing more than one bit of data. The information that a given EEPROM array can store is thus increased with the number of states that each cell can store. EEPROM or flash EEPROM with multi-state or multi-level memory cells have been described in U.S. Pat. No. 5,172,338.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line.

FIG. 4 illustrates the relation between the source-drain current $I_D$ and the control gate voltage $V_{CG}$ for four different charges Q1-Q4 that the floating gate may be selectively storing at any one time. The four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Six memory states may be demarcated by partitioning the threshold window into five regions in interval of 0.5V each. For example, if a reference current, $I_{REF}$ of 2 µA is used as shown, then the cell programmed with Q1 may be considered to be in a memory state "1" since its curve intersects with $I_{REF}$ in the region of the threshold window demarcated by $V_{CG}$=0.5V and 1.0V. Similarly, Q4 is in a memory state "5".

As can be seen from the description above, the more states a memory cell is made to store, the more finely divided is its threshold window. This will require higher precision in programming and reading operations in order to be able to achieve the required resolution.

U.S. Pat. No. 4,357,685 discloses a method of programming a 2-state EPROM in which when a cell is programmed to a given state, it is subject to successive programming voltage pulses, each time adding incremental charge to the floating gate. In between pulses, the cell is read back or verified to determine its source-drain current relative to the breakpoint level. Programming stops when the current state has been verified to reach the desired state. The programming pulse train used may have increasing period or amplitude.

Prior art programming circuits simply apply programming pulses to step through the threshold window from the erased or ground state until the target state is reached. Practically, to allow for adequate resolution, each partitioned or demarcated region would require at least about five programming steps to transverse. The performance is acceptable for 2-state memory cells. However, for multi-state cells, the number of steps required increases with the number of partitions and therefore, the programming precision or resolution must be increased. For example, a 16-state cell may require on average at least 40 programming pulses to program to a target state.

FIG. 5 illustrates schematically a memory device with a typical arrangement of a memory array 100 accessible by read/write circuits 170 via row decoder 130 and column decoder 160. As described in connection with FIGS. 2 and 3, a memory transistor of a memory cell in the memory array 100 is addressable via a set of selected word line(s) and bit line(s). The row decoder 130 selects one or more word lines and the column decoder 160 selects one or more bit lines in order to apply appropriate voltages to the respective gates of the addressed memory transistor. Read/write circuits 170 are provided to read or write (program) the memory states of addressed memory transistors. The read/write circuits 170 comprise a number of read/write modules connectable via bit lines to memory elements in the array.

Factors Affecting Read/Write Performance and Accuracy

In order to improve read and program performance, multiple charge storage elements or memory transistors in an array are read or programmed in parallel. Thus, a logical "page" of memory elements are read or programmed together. In existing memory architectures, a row typically contains several interleaved pages. All memory elements of a page will be read or programmed together. The column decoder will selectively connect each one of the interleaved pages to a corresponding number of read/write modules. For example, in one implementation, the memory array is designed to have a page size of 532 bytes (512 bytes plus 20 bytes of overheads.) If each column contains a drain bit line and there are two interleaved pages per row, this amounts to 8512 columns with each page being associated with 4256 columns. There will be 4256 sense modules connectable to read or write in parallel either all the even bit lines or the odd bit lines. In this way, a page of 4256 bits (i.e., 532 bytes) of data in parallel are read from or programmed into the page of memory elements. The read/write modules forming the read/write circuits 170 can be arranged into various architectures.

As mentioned before, conventional memory devices improve read/write operations by operating in a massively parallel manner on all even or all odd bit lines at a time. This "alternate-bit-line" architecture of a row consisting of two interleaved pages will help to alleviate the problem of fitting the block of read/write circuits. It is also dictated by consideration of controlling bit-line to bit-line capacitive coupling. A block decoder is used to multiplex the set of read/write modules to either the even page or the odd page. In this way, whenever one set bit lines are being read or programmed, the interleaving set can be grounded to minimize immediate neighbor coupling.

However, the interleaving page architecture is disadvantageous in at least three respects. First, it requires additional multiplexing circuitry. Secondly, it is slow in performance. To finish read or program of memory cells connected by a word line or in a row, two read or two program operations are required. Thirdly, it is also not optimum in addressing other disturb effects such as field coupling between neighboring charge storage elements at the floating gate level when the two neighbors are programmed at different times, such as separately in odd and even pages.

United States Patent Publication No. 2004-0057318-A1 discloses a memory device and a method thereof that allow sensing a plurality of contiguous memory cells in parallel. For example, all memory cells along a row sharing the same word lines are read or programmed together as a page. This "all-bit-line" architecture doubles the performance of the "alternate-bit-line": architecture while minimizing errors caused by neighboring disturb effects. However, sensing all bit lines does bring up the problem of cross-talk between neighboring bit lines due induced currents from their mutual capacitance. This is addressed by keeping the voltage difference between each adjacent pair of bit lines substantially independent of time while their conduction currents are being sensed. When this condition is imposed, all displacement currents due to the various bit lines' capacitance drop out since they all depend on a time varying voltage difference. The sensing circuit coupled to each bit line has a voltage clamp on the bit line so that the potential difference on any adjacent pair of connected bit lines is time-independent. With the bit line voltage clamped, the conventional method of sensing the discharge due to the bit line capacitance can not be applied. Instead, the sensing circuit and method allow determination of a memory cell's conduction current by noting the rate it discharges or charges a given capacitor independent of the bit line. This will allow a sensing circuit independent of the architecture of the memory array (i.e., independent of the bit line capacitance.) Especially, it allows the bit line voltages to be clamped during sensing in order to avoid bit line crosstalk.

As mentioned before, conventional memory devices improve read/write operations by operating in a massively parallel manner. This approach improves performance but does have repercussions on the accuracy of read and write operations.

One issue is the source line bias error. This is particular acute for memory architecture where a large number memory cells have their sources coupled together in a source line to ground. Parallel sensing of these memory cells with common source results in a substantial current through the source line. Owing to a non-zero resistance in the source line, this in turn results in an appreciable potential difference between the true ground and the source electrode of each memory cell. During sensing, the threshold voltage supplied to the control gate of each memory cell is relative to its source electrode but the system power supply is relative to the true ground. Thus sensing may become inaccurate due to the existence of the source line bias error.

United States Patent Publication. No. 2004-0057287-A1 discloses a memory device and a method thereof that allow sensing a plurality of contiguous memory cells in parallel. The reduction in source line bias is accomplished by read/write circuits with features and techniques for multi-pass sensing. When a page of memory cells are being sensed in parallel, each pass helps to identify and shut down the memory cells with conduction current higher than a given demarcation current value. The identified memory cells are shut down by pulling their associated bit lines to ground. In other words, those cells having higher conduction current and irrelevant to the present sensing are identified and have their current shut down before the actual data of the current sensing is read.

Therefore there is a general need for high performance and high capacity non-volatile memory with reduced power consumption. In particular, there is a need for a compact non-volatile memory with enhanced read and program performance that is power efficient.

SUMMARY OF INVENTION

These needs for a high capacity and high performance non-volatile memory device are met by having a large page of read/write circuits to read and write a corresponding page of memory cells in parallel. In particular, interactive noises effects inherent in high density chip integration are that may introduce errors into reading and programming are either eliminated or minimized.

Source line bias is an error introduced by a non-zero resistance in the ground loop of the read/write circuits. The error is caused by a voltage drop across the resistance of the source path to the chip's ground when current flows.

A non-volatile memory device having individual pages of memory cells to be sensed in parallel, where each memory cell has a source, a drain, a charge storage unit and a control gate for controlling a conduction current along said drain and source, is presented. The memory device includes a page source line coupled to the source of each memory cell in a page, an aggregate node coupled to individual page source lines, a source voltage control circuit coupled by way of said aggregate node to a page source line of a selected page for memory operation, and a word line coupling to the control gate of each memory cell of said page. A word line voltage supply for provides a predetermined word line voltage to the word line of each memory cell of said page for a sensing operation. The memory device also includes a source level tracking circuit coupled to receive the word line voltage and the voltage level at the aggregate node and coupled to provide to the word line an output voltage during the sensing operation, where the source level tracking circuit includes an op amp with an output providing the output voltage and having a first input connected to receive a voltage derived from the word line voltage and the aggregate node voltage and having a second input connected by a feedback loop from the output.

A non-volatile memory device having individual pages of memory cells to be sensed in parallel, where each memory cell has a source, a drain, a charge storage unit and a control gate for controlling a conduction current along said drain and source, is presented. The memory device includes a page source line coupled to the source of each memory cell in a page, an aggregate node coupled to individual page source lines, a source voltage control circuit coupled by way of said aggregate node to a page source line of a selected page for memory operation, and a word line coupling to the control gate of each memory cell of said page. A word line voltage supply for provides a predetermined word line voltage to the word line of each, memory cell of said page for a sensing operation. The memory device also includes a source level tracking circuit coupled to receive the word line voltage and the voltage level at the aggregate node and coupled to provide to the word line an output voltage during the sensing operation, where the source level tracking circuit includes an op amp whereby the output voltage is the word line voltage offset by an amount to track the voltage level at the aggregate node.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION OF THE PREFERRED EMBODIMENTS

Figure 6A:
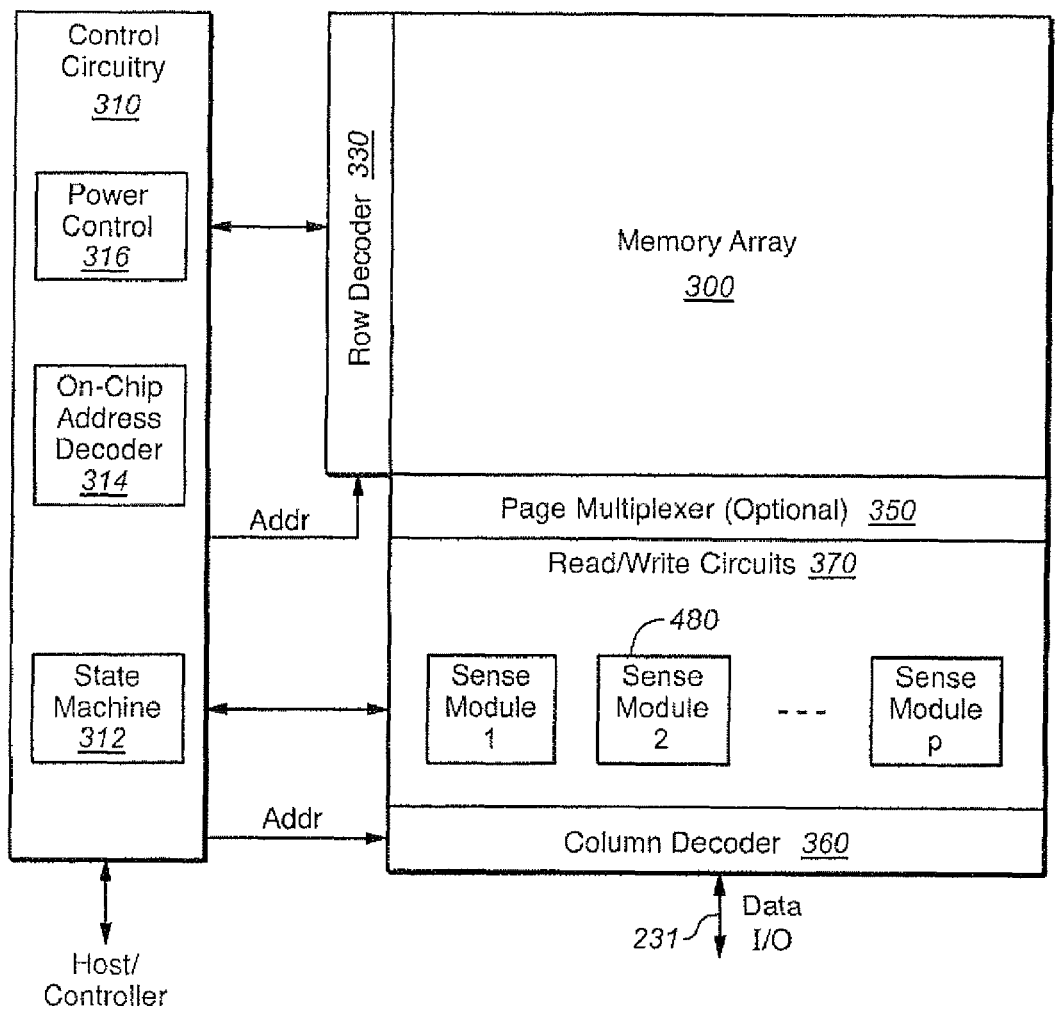
FIG. 6A illustrates schematically a compact memory device having a bank of read/write circuits, which provides the context in which the present invention is implemented.

FIG. 6A illustrates schematically a compact memory device having a bank of read/write circuits, which provides the context in which the present invention is implemented. The memory device includes a two-dimensional array of memory cells 300, control circuitry 310, and read/write circuits 370. The memory array 300 is addressable by word lines via a row decoder 330 and by bit lines via a column decoder 360. The read/write circuits 370 is implemented as a bank of sense modules 480 and allows a block (also referred to as a "page") of memory cells to be read or programmed in parallel. In a preferred embodiment, a page is constituted from a contiguous row of memory cells. In another embodiment, where a row of memory cells are partitioned into multiple blocks or pages, a block multiplexer 350 is provided to multiplex the read/write circuits 370 to the individual blocks.

The control circuitry 310 cooperates with the read/write circuits 370 to perform memory operations on the memory array 300. The control circuitry 310 includes a state machine 312, an on-chip address decoder 314 and a power control module 316. The state machine 312 provides chip level control of memory operations. The on-chip address decoder 314 provides an address interface between that used by the host or a memory controller to the hardware address used by the decoders 330 and 370. The power control module 316 controls the power and voltages supplied to the word lines and bit lines during memory operations.

Figure 6B:
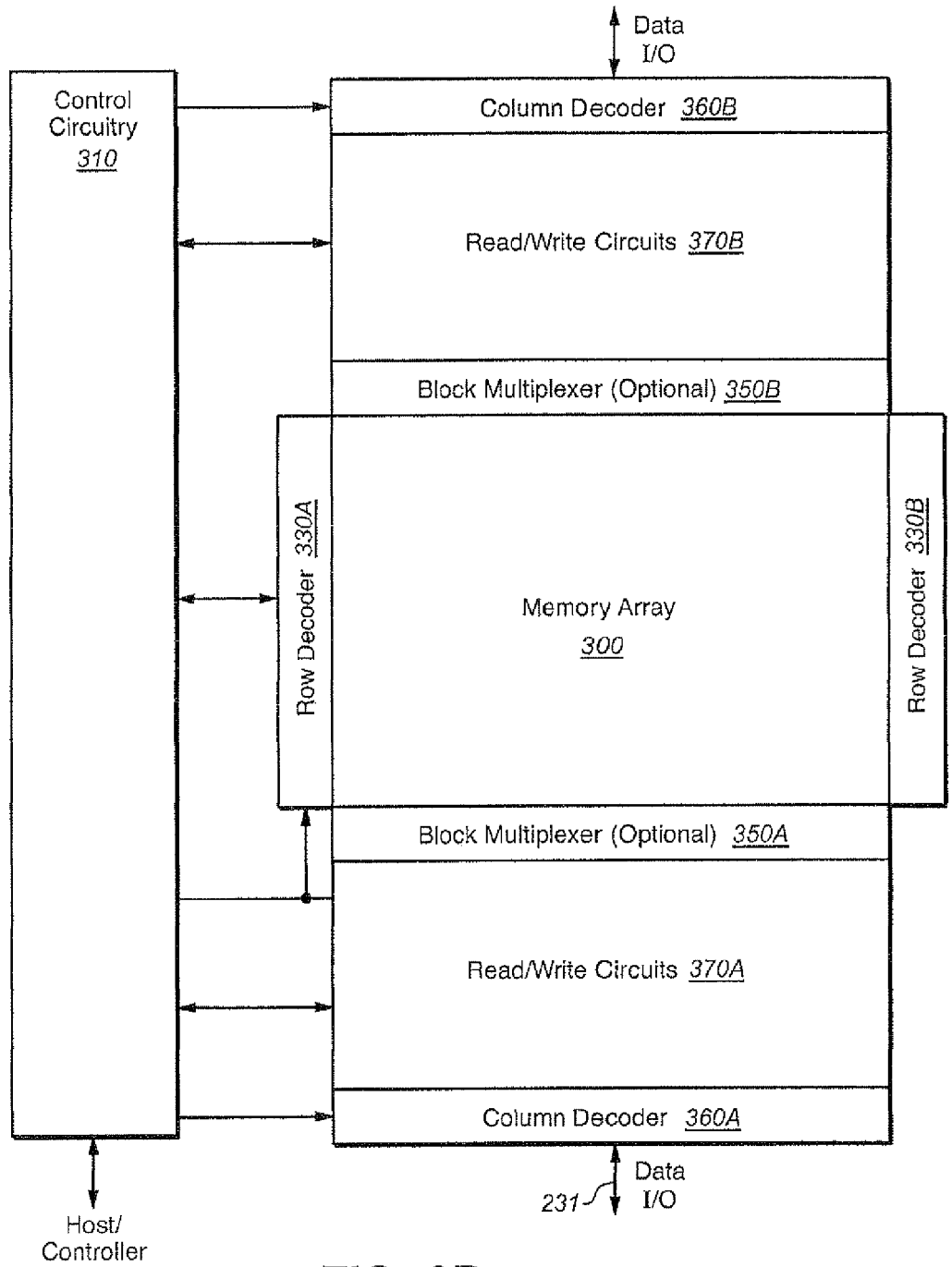
FIG. 6B illustrates a preferred arrangement of the compact memory device shown in FIG. 6A.

FIG. 6B illustrates a preferred arrangement of the compact memory device shown in FIG. 6A. Access to the memory array 300 by the various peripheral circuits is implemented in a symmetric fashion, on opposite sides of the array so that access lines and circuitry on each side are reduced in half. Thus, the row decoder is split into row decoders 330A and 330B and the column decoder into column decoders 360A and 360B. In the embodiment where a row of memory cells are partitioned into multiple blocks, the block multiplexer 350 is split into block multiplexers 350A and 350B. Similarly, the read/write circuits are split into read/write circuits 370A connecting to bit lines from the bottom and read/write circuits 370B connecting to bit lines from the top of the array 300. In this way, the density of the read/write modules, and therefore that of the bank of sense modules 480, is essentially reduced by one half.

The entire bank of p sense modules 480 operating in parallel allows a block (or page) of p cells along a row to be read or programmed in parallel. One example memory array may have p=512 bytes (512×8 bits). In the preferred embodiment, the block is a run of the entire row of cells. In another embodiment, the block is a subset of cells in the row. For example, the subset of cells could be one half of the entire row or one quarter of the entire row. The subset of cells could be a run of contiguous cells or one every other cell, or one every predetermined number of cells. Each sense module includes a sense amplifier for sensing the conduction current of a memory cell. A preferred sense amplifier is disclosed in United States Patent Publication No. 2004-0109357-A1, the entire disclosure of which is hereby incorporated herein by reference.

Source Line Error Management

One potential problem with sensing memory cells is source line bias. When a large number memory cells are sensed in parallel, their combine currents can result in significant voltage drop in a ground loop with finite resistance. This results in a source line bias which causes error in a sensing operation employing threshold voltage sensing. Also, if the cell is operating close to the linear region, the conduction current is sensitive to the source-drain voltage once in that region, and the source line bias will cause error in a sensing operation when the drain voltage is offset by the bias.

Figure 7A:
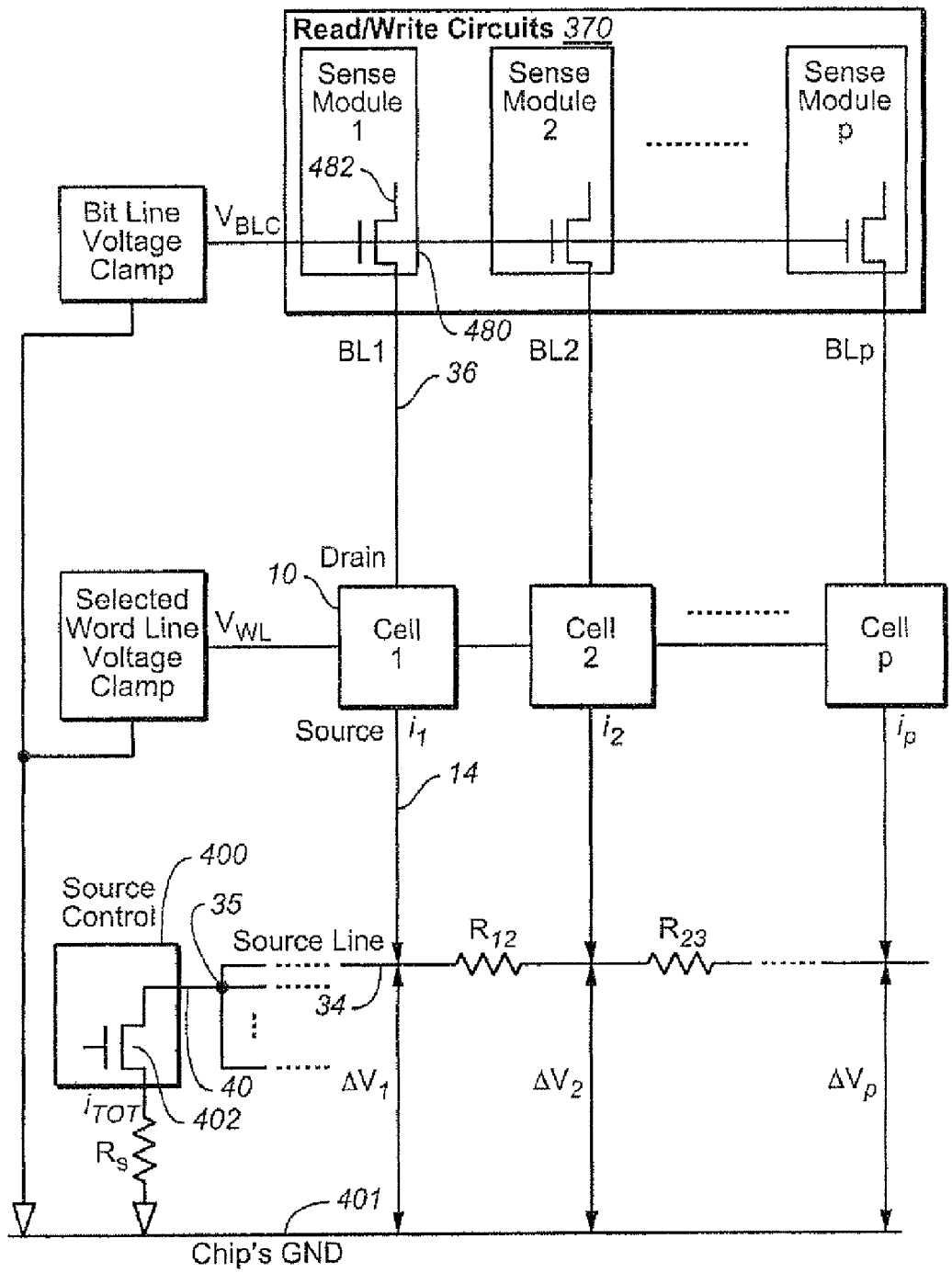
FIG. 7A illustrates a conventional arrangement in which a bit line voltage control, a word line voltage control and a source voltage control are all referencing from the same ground of the IC memory chip.

FIG. 7A illustrates a conventional arrangement in which a bit line voltage control, a word line voltage control and a source voltage control are all referencing from the same ground of the IC memory chip. The read/write circuits 370 operate on a page of memory cells simultaneously. Each sense module 480 in the read/write circuits is coupled to a corresponding cell via a bit line, such as a bit line 36. For example, a sense module 480 senses the conduction current $i_J$ (source-drain current) of a memory cell 10. The conduction current flows from the sense module through the bit line 36 into the drain of the memory cell 10 and out from the source 14 before going through a source line 34 and a consolidated source line 40 and then to the chip's ground 401 via a source control circuit 400. The source line 34 typically joins all the sources of the memory cells in a page along a row in a memory array. In an integrated circuit chip, the source lines 34 of the individual rows in a memory array are all tied together as multiple branches of the consolidated source line 40 connected to the source control circuit 400. The source control circuit 400 has a pull-down transistor 402 controlled to pull the consolidated source line 40 to the chip's ground 401, which is ultimately connected to an external ground pad (e.g. Vss pad) of the memory chip. Even when metal strapping is used to reduce the resistance of the source line, a non-zero resistance R remains between the source electrode of a memory cell and the ground pad. Typically, the average ground loop resistance R can be as high as 50 ohm.

Figure 1A:
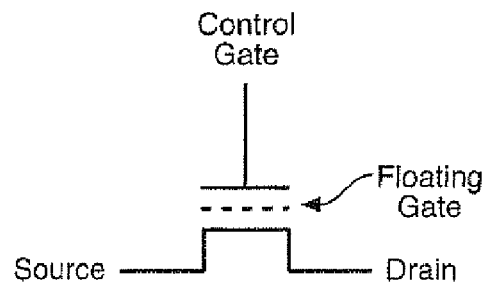
FIGS. 1A-1E illustrate schematically different examples of non-volatile memory cells.
Figure 1B:
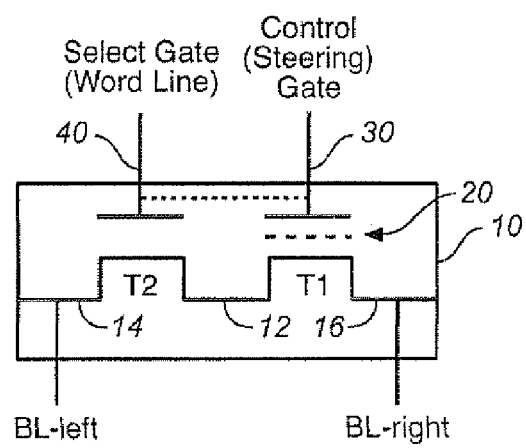
Figure 1C:
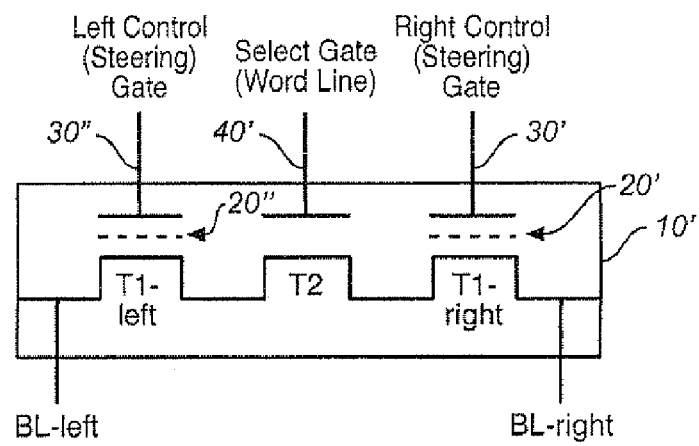
Figure 1D:
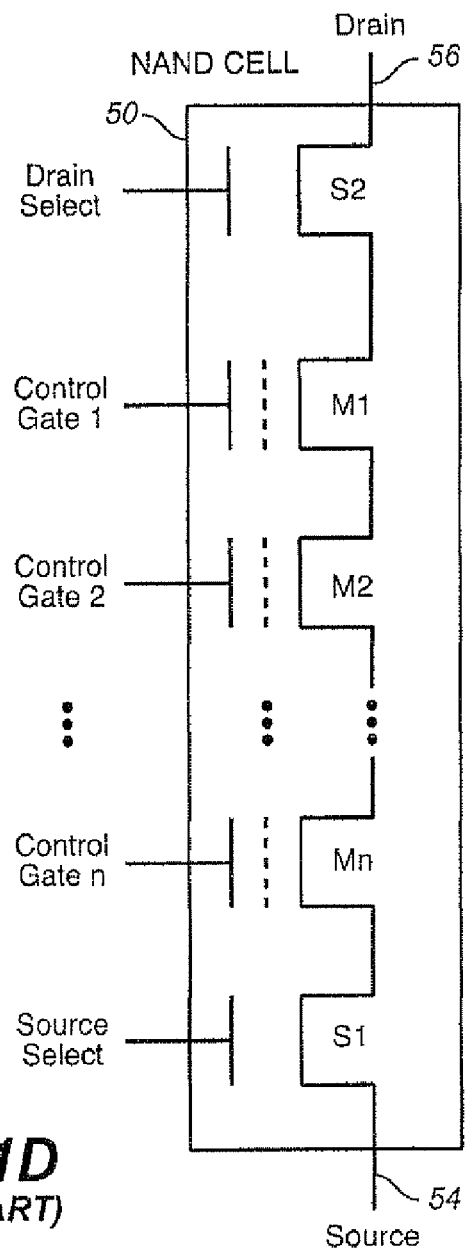
Figure 1E:
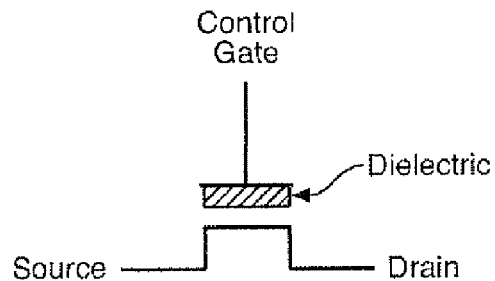
Figure 2:
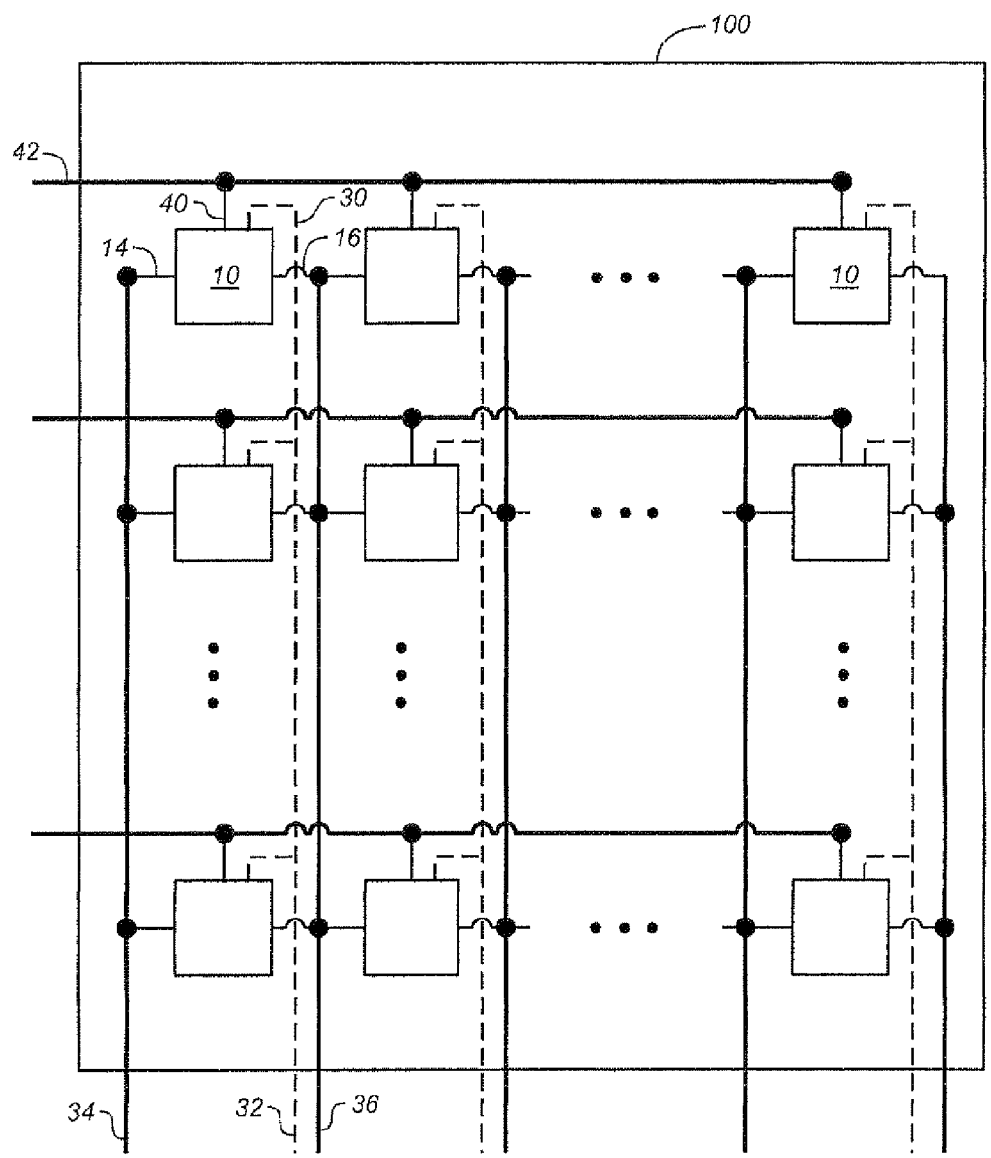
FIG. 2 illustrates an example of an NOR array of memory cells.
Figure 3:
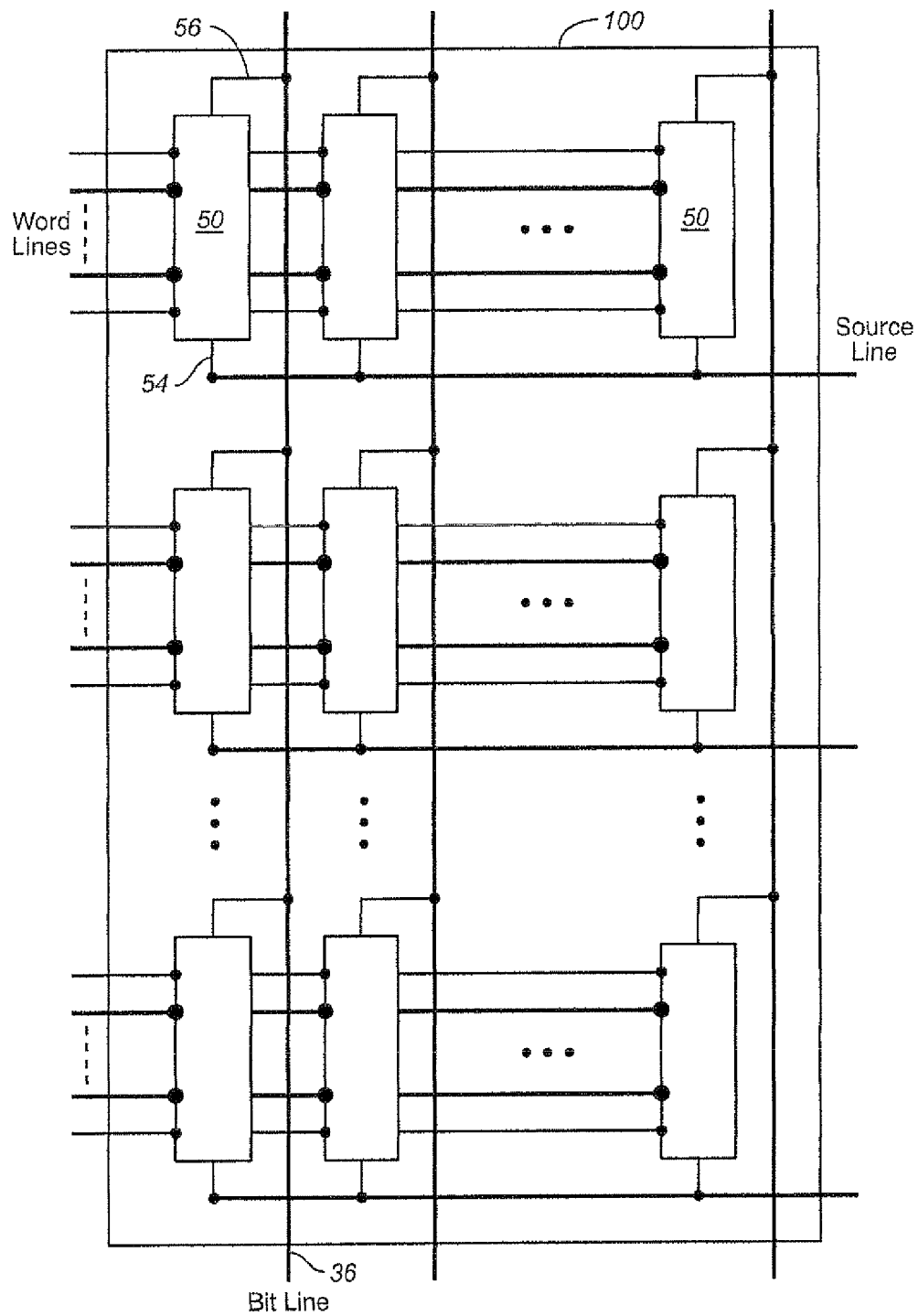
FIG. 3 illustrates an example of an NAND array of memory cells, such as that shown in FIG. 1D.
Figure 4:
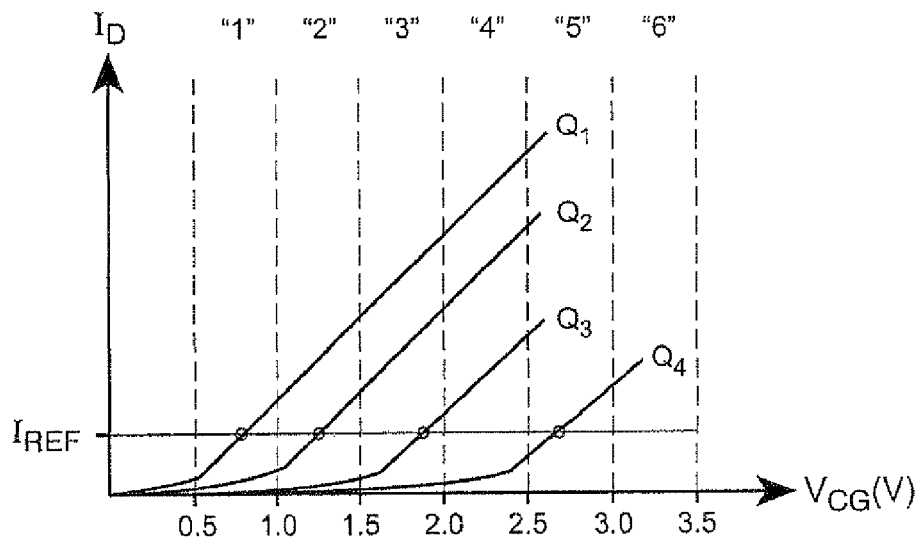
FIG. 4 illustrates the relation between the source-drain current and the control gate voltage for four different charges Q1-Q4 that the floating gate may be storing at any one time.
Figure 5:
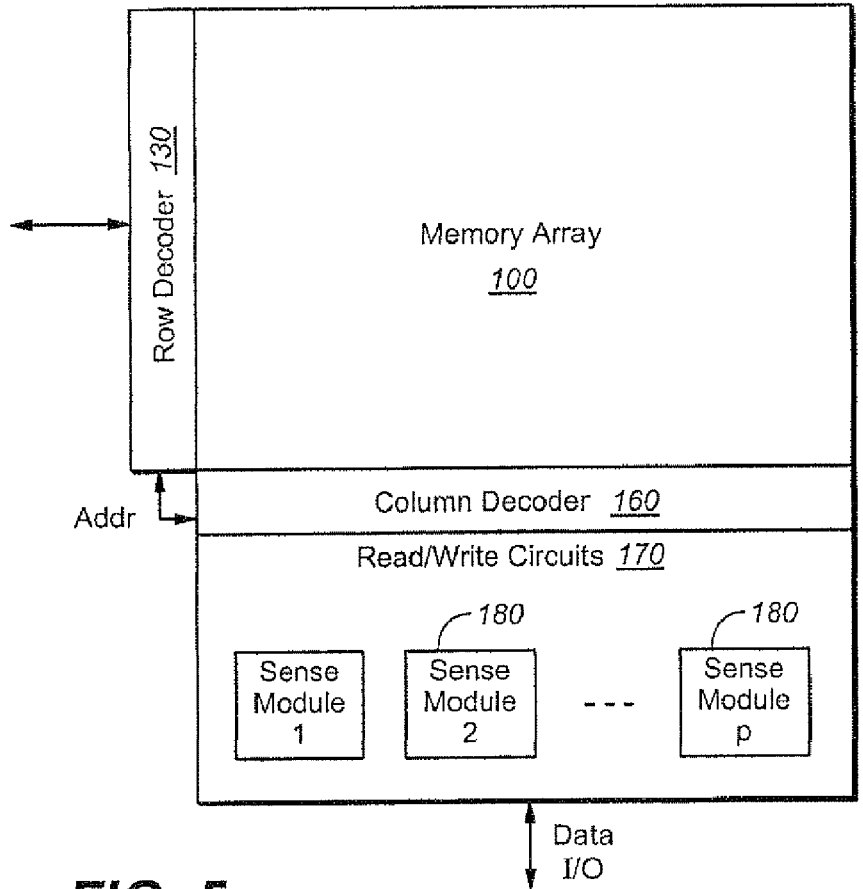
FIG. 5 illustrates schematically a typical arrangement of a memory array accessible by read/write circuits via row and column decoders.

For the entire page of memory being sensed in parallel, the total current flowing through the consolidated source line 40 is the sum of all the conduction currents, i.e. $i_{TOT}=i_1+i_2+\ldots,+i_p$. Generally each memory cell has a conduction current dependent on the amount of charge programmed into its charge storage element. For a given control gate voltage of the memory cell, a smaller programmed charge will yield a comparatively higher conduction current (see FIG. 4.) When a finite resistance exists in the path between the source electrode of a memory cell and the ground pad, the voltage drop across the resistance is given by $V_{drop} \sim i_{TOT} R$.

For example, if 4,256 bit lines discharge at the same time, each with a current of 1 μA, then the source line voltage drop will be equal to 4000 lines×1 μA/line×50 ohms~0.2 volts. This means instead of being at ground potential, the effective source is now at 0.2V. Since the bit line voltage and the word line voltage are referenced with respect to the same chip's ground 401, this source line bias of 0.2 volts will have both the effective drain voltage and control gate voltage reduced by 0.2V.

Figure 7B:
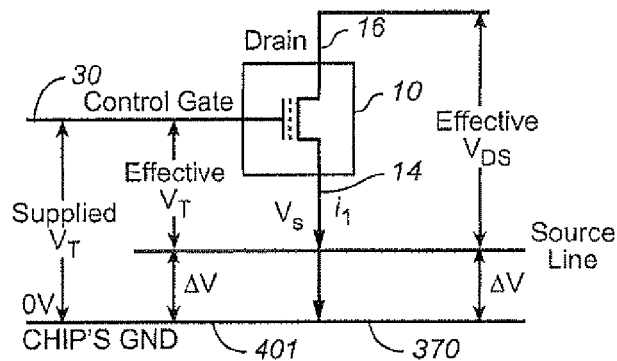
FIG. 7B illustrates the error in both the gate voltage and drain voltage of a memory cell caused by a source line voltage drop.

FIG. 7B illustrates the error in the threshold voltage level of a memory cell caused by a source line voltage drop. The threshold voltage $V_T$ supplied to the control gate 30 of the memory cell 10 is relative to the chip's ground 401. However, the effective $V_T$ seen by the memory cell is the voltage difference between its control gate 30 and source 14. There is a difference of approximately $V_{drop}$ or $\Delta V$ between the supplied and effective $V_T$ (ignoring the smaller contribution of voltage drop from the source 14 to the source line.) This $\Delta V$ or source line bias will contribute to a sensing error of, for example 0.2 volts when threshold voltages of the memory cells are sensed. This bias cannot be easily removed as it is data-dependent, i.e., dependent on the memory states of the memory cells of the page.

FIG. 7B also illustrates the error in the drain voltage level of a memory cell caused by a source line voltage drop. The drain voltage applied to the drain 16 of the memory cell 10 is relative to the chip's ground 401. However, the effective drain voltage, $V_{DS}$, seen by the memory cell is the voltage difference between its drain 16 and source 14. There is a difference of approximately $\Delta V$ between the supplied and effective $V_{DS}$. This $\Delta V$ or source line bias will contribute to a sensing error when the memory cells are sensed in an operating region sensitive to $V_{DS}$. As described above, this bias cannot be easily removed as it is data-dependent, i.e., dependent on the memory states of the memory cells of the page.

Figure 8:
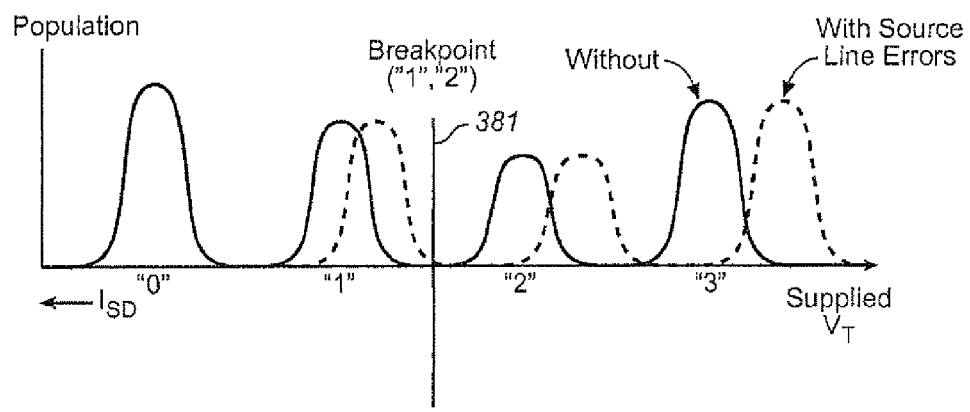
FIG. 8 illustrates the effect of source bias errors in an example population distribution of a page of memory cells for a 4-state memory.

FIG. 8 illustrates the effect of source bias errors in an example population distribution of a page of memory cells for a 4-state memory. Each cluster of memory state is programmed within a range of conduction currents $I_{SD}$ clearly separated from each other. For example, a breakpoint 381 is a demarcating current value between two clusters, respectively representing the "1" and "2" memory states. A necessary condition for a "2" memory state will be that it has a conduction current less than the breakpoint 381. If there were no source line bias, the population distribution with respect to the supplied threshold voltage $V_T$ will be given by the curve with the solid line. However, because of the source line bias error, the effective threshold voltage of each of the memory cells at its control gate is reduced from the supplied voltage relative to ground by the source line bias $\Delta V$. Similarly, the effective drain voltage is also reduced from the supplied voltage by the source line bias.

The source line bias results in a shifting of the distribution (broken line) towards a higher supplied $V_T$ to make up for the shortfall in the effective voltage. The shifting will be more for that of the higher (lower current) memory states. If the breakpoint 381 is designed for the case without source line error, then the existence of a source line error will have some of the tail end of "1" states having conduction currents to appear in a region of no conduction, which means higher than the breakpoint 381. This will result in some of the "1" states (more conducting) being mistakenly demarcated as "2" states (less conducting.)

Wordline Voltage Tracking with Local Source Level

As discussed in the preceding sections, as memory density increases, the combined total memory cell current can cause the source voltage (array ground) to evaluated by up to several tenths of a volt in current designs, with the resultant sensing errors described with respect to FIG. 7B and FIG. 8. In multi-plane read/verify operations, each plane may have a different array ground potential due to distribution of threshold voltage in each plane. With standard word line voltage biasing schemes, the offset in sensing threshold voltages will be large between when cells are in a conducting state or an off state. To avoid misdetection in these circumstances would consequently require greater separation between threshold distributions unless this bounce in the source potential is accounted for.

The embodiments presented in this section allow the control gate voltage levels applied to memory cells in sensing operations, such as read and verify, to track the raised array ground potential. Without needing to modify existing read/verify voltage generators, the embodiments presented in this section can be used to help resolve theses array ground and multi-plane operation issues with relatively effect on die size or power consumption.

In addition to the techniques presented in this section, other methods for dealing with the sort of source level, or array ground, bounce relative to the chip's ground level are given in U.S. Pat. Nos. 7,170,784 and 7,173,854 and in the US patent application entitled "Regulation of Source Potential to Combat Cell Source IR Drop" by Dana Lee, Nima Mokhlesi, and Deepak Chandra Sekar, filed concurrently with the present application. These various approaches have various relative advantages and are complimentary, in that one or more of them may be combined for a particular application, the choice being a design decision based on balancing the various needs of performance, area layout, power consumption, and so, as will be familiar to those in the art. The embodiments of this section provide good response time, have low current draw, use relatively little die area, and require no change on existing voltage bias circuits.

Figure 9:
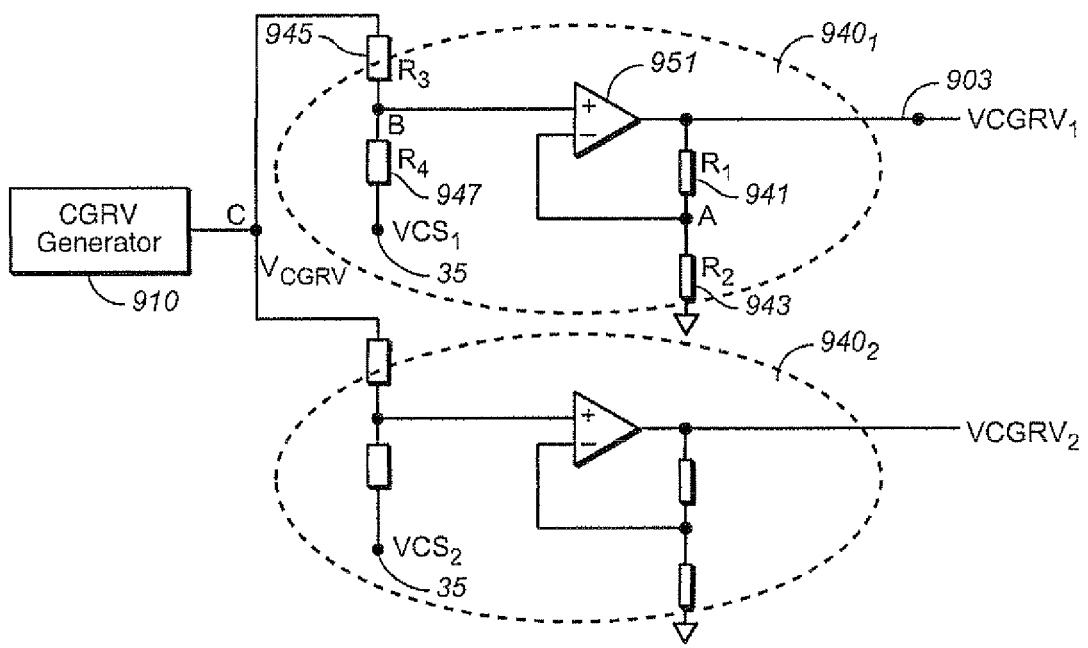
FIG. 9 shows an exemplary embodiment of a word line voltage generation circuit for tracking the local source voltage.

FIG. 9 shows an exemplary embodiment of a circuit that allows the word line voltage to track the bounce seen at the aggregate source of an array segment. The control gate read voltage (CGRV) generator 910 provides the voltage levels that are used during operations and can be any of those found or to be developed in the art. For example, U.S. patent application Ser. Nos. 11/618,541 and 11/499,067 describes versions that incorporate temperature compensation. The output $V_{CGRV}$ is provided to a node C, from which it is distributed to the various planes. This voltage would then be used to provide the bias levels by way of the selected word lines to the cells being sensed. (The various switches and control circuitry that couple these read or verify voltages during a sense operation are not explicitly shown here, but will be understood as being any of those familiar in the art.) The exemplary embodiment of FIG. 9 adds the local $V_{CGRV}$ tracking element 940 to each plane at some point between the received value of $V_{CGRV}$ at the plane and the supplying of this voltage to the word lines.

It should be noted that the present description is given in term of one local tracking element 940 per plane. In other embodiments, it could be implemented at different levels for other substructures that are used in sensing processes. For example, rather than regulate the whole a structural block together at the aggregate source node 35, the individual pages could also be regulated (i.e., regulate each of the source lines 34 of FIG. 7A instead of composite line 40) if closer regulation is wanted; however, this would be at the cost of increased circuitry and complexity.

Each plane can have a local tracking circuit, two of which ($940_1$, $940_2$) are shown. Each tracking circuit 940 will have as inputs $V_{CGRV}$ supplied form node C and the local array ground level $V_{CS}$ that is taken at the aggregate source node 35 (see FIG. 7A) for the plane (or the appropriate node corresponding to the page or pages being sensed), as well as any needed power supply and ground connections. As output, the tracking circuit 940 will have the compensated control gate read voltage $V'_{CGRV}$, which is than passed on to be used on the selected word lines in a sensing operation. In the exemplary embodiment, the circuit is constructed so that $V'_{CGRV}=V_{CGRV}+V_{CS}$ and $V'_{CGRV}$ is part of a feedback loop to an active circuit element, so that the control voltages will be compensated by the same amount the source level is raised. In alternate versions, the compensation can be changed to track a different amount, $V'_{CGRV}=V_{CGRV}+cV_{CS}$, where c is some constant; for example, c could be taken slightly largely than one if it is desired to provide a little additional compensation, or if there is an extra voltage drop from the actual cell source to the Vcs being tracked.

In the embodiment of FIG. 9, the + input of op amp 951 is supplied by a node B between a pair of resistive elements $R_3$ 945 and $R_4$ 947 in series between $V_{CGRV}$, as supplied from the CGRV generator 910, and $V_{CS}$, as supplied from the aggregate node 35. The − input of the op amp 951 is feed by the feedback loop the output, taken from node A between resistive element $R_1$ 941 and $R_2$ 943 connected in series between the output of op amp 951 and ground.

In the exemplary embodiment, the resistive elements $R_1$ 941, $R_2$ 943, $R_3$ 945, and $R_4$ 947 all taken to have the same value, so that the voltage at node B is $V_B=(V_{CGRV}+V_{CS})/2$ and the output voltage on 903 is then $V'_{CGRV}=2V_B=V_{CGRV}+V_{CS}$ as desired. Other values can be used to have a different combination of the input voltages, to provide additional compensation for example.

In this basic embodiment, the circuitry needed for each plane is one op amp and 2 pairs of resistors for each plane. Alternately, instead of resistors dividers, capacitive divider could be used. The op amp can be implemented by any of the ways familiar in the art. Consequently, the impact on layout area is minor. As a voltage based implementation, the resultant current, and consequently power, requirements are also minimal. Additionally, there is no requirement of a high voltage power source to supply any of the elements.

Although the various aspects of the present invention have been described with respect to certain embodiments, it is understood that the invention is entitled to protection within the full scope of the appended claims.

What is claimed is:

1. In a non-volatile memory device having individual pages of memory cells to be sensed in parallel, each memory cell having a source, a drain, a charge storage unit and a control gate for controlling a conduction current along said drain and source, the memory device comprising:
    a page source line coupled to the source of each memory cell in a page;
    an aggregate node coupled to individual page source lines;
    a source voltage control circuit coupled via said aggregate node to a page source line of a selected page for memory operation;
    a word line coupling to the control gate of each memory cell of said page;
    a word line voltage supply for providing a predetermined word line voltage; and
    a source level tracking circuit connectable to receive the word line voltage and the voltage level at the aggregate node and connectable to provide to the word line an output voltage during the sensing operation, including an op amp whereby the output voltage is the word line voltage offset by an amount to track the voltage level at the aggregate node.

2. The non-volatile memory device of claim 1, wherein output voltage is equal to the sum of the word line voltage and a predetermined proportion of the voltage level at the aggregate node on source node.

3. The non-volatile memory device of claim 2, wherein output voltage is equal to the sum of the word line voltage and the voltage level at the aggregate node.

4. The non-volatile memory device of claim 1, wherein the sensing operation is a read operation.

5. The non-volatile memory device of claim 1, wherein the sensing operation is a verify operation.

6. The non-volatile memory device of claim 1, wherein the predetermined word line voltage includes temperature compensation.

7. In a non-volatile memory device having individual pages of memory cells to be sensed in parallel, each memory cell having a source, a drain, a charge storage unit and a control gate for controlling a conduction current along said drain and source, a method of sensing a page of memory cells, comprising:
providing a page source line;
coupling the source of each memory cell of said page to said page line source line;
providing an aggregate node coupled to individual page source lines;
coupling the aggregate node to a source voltage control circuit for a sensing operation;
providing a word line;
coupling the word line to the control gate of each memory cell of said page;
providing a predetermined word line voltage;
receiving the word line voltage and the voltage level at the aggregate node at a source level tracking circuit; and
providing to the word line an output voltage from the source level tracking circuit, the source level tracking circuit including an op amp whereby the output voltage is the word line voltage offset by an amount to track the voltage level at the aggregate node.

8. The method of claim 7, wherein output voltage is equal to the sum of the word line voltage and a predetermined proportion of the voltage level at the aggregate node on source node.

9. The method of claim 8, wherein output voltage is equal to the sum of the word line voltage and the voltage level at the aggregate node.

10. The method of claim 7, wherein the sensing operation is a read operation.

11. The method of claim 7, wherein the sensing operation is a verify operation.

12. The method of claim 7, wherein the predetermined word line voltage includes temperature compensation.

* * * * *